(12) United States Patent
Tanaka

(10) Patent No.: US 6,992,340 B2
(45) Date of Patent: Jan. 31, 2006

(54) SEMICONDUCTOR DEVICE

(75) Inventor: Masahiro Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 116 days.

(21) Appl. No.: 10/437,060

(22) Filed: May 14, 2003

(65) Prior Publication Data

US 2004/0009638 A1 Jan. 15, 2004

(30) Foreign Application Priority Data

Jun. 19, 2002 (JP) ......................................... 2002-177936
Mar. 31, 2003 (JP) ......................................... 2003-093839

(51) Int. Cl.
  *H01L 29/768* (2006.01)

(52) U.S. Cl. ........................ 257/244; 257/244; 257/330
(58) Field of Classification Search ................. 257/244, 257/330, 331, 341, 401, 350, 586, 764
See application file for complete search history.

(56) References Cited

U.S. PATENT DOCUMENTS 5,503,882 A   4/1996 Dawson
5,798,554 A * 8/1998 Grimaldi et al. ............. 257/401
5,963,837 A  10/1999 Ilg et al.
6,329,288 B1 * 12/2001 Tokushige et al. ........... 438/675

OTHER PUBLICATIONS

U.S. Appl. No. 10/437,060, filed May 14, 2003, Tanaka.
U.S. Appl. No. 10/814,246, filed Apr. 1, 2004, Okuno et al.

* cited by examiner

*Primary Examiner*—Michael Tran
*Assistant Examiner*—Thinh T Nguyen
(74) *Attorney, Agent, or Firm*—Oblon, Spivak, McClelland, Maier & Neustadt, P.C.

(57) ABSTRACT

A semiconductor device includes spaced-apart first and second element formation regions which are formed in a main surface of a semiconductor substrate, a dielectric film which is formed on the main surface of the semiconductor substrate at a location between the first and second element formation regions, first electrode patterns which are formed above the first and second element formation regions respectively and each of which has an end portion extended to overlie the dielectric film, the first electrode patterns being formed by patterning of a first electrode layer, second electrode patterns formed above the first electrode patterns respectively, and a passivation film which is formed above the first electrode patterns to be positioned adjacent to the second electrode patterns while covering part of the dielectric film which is exposed during patterning of the first electrode layer.

23 Claims, 13 Drawing Sheets

SEMICONDUCTOR DEVICE

CROSS-REFERENCE TO RELATED APPLICATIONS

This application is based upon and claims the benefit of priority from the prior Japanese Patent Application No. 2002-177936, filed on Jun. 19, 2002, and Japanese Patent Application No. 2003-93839, filed on Mar. 31, 2003, the entire contents of which are incorporated herein by reference.

BACKGROUND OF THE INVENTION

1. Field of the Invention

The present invention relates to semiconductor devices and, more particularly, to semiconductor devices of the type having reduced thicknesses. This invention also relates to structures of terminate end portions of such thin semiconductor devices.

2. Description of Related Art

In recent years, in the field of integrated circuit (IC) and memory devices, an attempt is made to miniaturize or shrink chip packages both in thickness and in size by forming semiconductor substrates to a reduced thickness.

In the field of vertically structured or "vertical-access" semiconductor devices which provide electrodes on the both principal surfaces of a semiconductor substrate to thereby permit current flow in a direction along the thickness of the semiconductor substrate, the reduced-thickness or "ultra-thin" semiconductor substrate fabrication technologies are employed to reduce losses, thereby improving the characteristics thereof. Typically the semiconductor substrate is formed so that its thickness is reduced to approximately one third (1/3) to one fourth (1/4) of its initial value that is 600 micrometers ($\mu$m) or more or less. When the semiconductor substrate is thinly formed from the beginning of fabrication process, the semiconductor substrate can deform or become readily destructible due to the influence of thermal processing or the like. Accordingly, an ordinary approach to obtaining an ultrathin substrate is to use a wafer with its thickness greater than a prespecified value. After having formed gate structures and electrodes on one principal surface of the wafer, let the other principal surface be subjected to micro-machining by grinding tools such as micro-grinding stones or rubstones to thereby form the intended thin semiconductor substrate with a desired thickness. Then, form electrodes on or above the other main surface thereof.

FIG. 19 illustrates, in cross-section, part of a generally available semiconductor device having on-chip cells. A semiconductor substrate 1901 has one principal or main surface, in which a base region 1911 is formed. In this base region 1911, circuit element formation regions 1902 are formed so that these are laterally spaced apart from each other. These spaced-apart element formation regions may be source regions of first and second cells. The semiconductor substrate 1901 has the other main surface, in which an element formation region 1915 is provided, such as a drain region. An electrode pattern 1917 is formed on the element formation region 1915. An electrically insulative or dielectric film 1903, such as for example an oxide film or the like, is formed on the one main surface of semiconductor substrate 1901. The dielectric film 1903 overlying the element formation regions 1902 is partly removed away for formation of electrical contacts therein. In addition, gate electrodes 1904 are formed on patterned gate insulation films 1903a within the cells. An interlayer dielectric (ILD) film 1905 is formed on an upper portion and sidewalls of each gate electrode 1904.

At the upper portion of each element formation region 1902, a first electrode pattern 1906 is formed which is made of a first conductive material such as titanium or the like. On this pattern 1906, a second electrode pattern 1908 is formed which is made of a second conductive material such as aluminum or else. A stacked structure of these patterns 1906 and 1907 constitutes a multilayer electrode pattern 1908. In this example two adjacent multilayer electrode patterns 1908 are shown, which have the opposing end portions that are formed to extend to overlie the dielectric film 1903 respectively, with a groove defined between these end portions. The first electrode pattern 1906 is the so-called barrier metal, which is formed in order to reduce unwanted diffusion into the semiconductor substrate 1901 of the metal that makes up the second electrode pattern 1907 to be formed at the upper part. An electrical wire 1913 is connected by known bonding techniques to the individual multilayer electrode pattern 1908.

A passivation film 1909 is formed between the neighboring cells in such a manner as to "bridge" between peripheral portions of the electrode patterns 1908 while at the same time spanning a portion of the dielectric film 1903 which is exposed within the groove between these electrode patterns 1908. The passivation film 1909 has functionality for protecting the device against external contamination and pollution, and is formed in order to avoid the influenceability upon the device characteristics otherwise occurring due to ionization of water components being attached to the exposed dielectric film and also preclude accidental electrical short-circuiting, which can result in destruction of on-chip integrated circuit elements in the worst case.

Additionally it is required that the passivation film 1909 be formed to have its thickness greater than a predetermined value. This is in order to permit passivation film 1909 to retain its expected functionality in view of the fact that at later steps in the manufacture of the device water components or else gradually intrude or "invade" from the upper ends of such passivation film as indicated by arrows in FIG. 19, resulting in occurrence of contamination. In FIG. 19 a need is felt to form the passivation film 1909 on the multilayer electrode patterns 1908 so that its thickness t measures about 10 $\mu$m or greater, by way of example. More specifically the multilayer electrode patterns 1908 and the passivation film 1909 formed thereon cause occurrence of a convexo-concave surface configuration or irregularity with a thickness t.

See FIG. 20, which shows another exemplary semiconductor device. Main parts of its cells are omitted from the illustration. The same parts or components of the device structure shown in FIG. 20 are designated by the same reference numerals, and any detailed explanation thereof is eliminated herein. On a dielectric film 1903 lying between end portions of adjacent multilayer electrode patterns 1908, a wiring pattern 2007 is formed which is structured from stacked two layers: a lower layer 2004, and an upper layer 2005. These layers are made of the same conductive materials as those of the stacked layers 1906, 1907 making up the individual electrode pattern 1908. The presence of such two-layered wiring pattern 2007 laterally interposed between the electrode patterns 1908 results in formation of a plurality of—here, two—grooves.

A passivation film 1909 is formed to bury the grooves. More specifically this film extends to cover exposed surface portions of the dielectric film 1903 within the grooves between the electrode patterns 1908 and the intermediate wiring pattern 2007 while spanning or "riding on" the top surface of wiring pattern 2007 and the top surfaces of electrode patterns 1908.

In FIG. 20, it is necessary to form the passivation film 1909 overlying the electrode patterns 1908 and wiring pattern 2007 so that its thickness t measures about 10 μm or more. Note here that the presence of the stacked electrode patterns 1908 and the passivation film 1909 as formed to overlie electrode patterns 1908 and wiring pattern 2007 results in creation of a surface irregularity with a thickness t.

In a fabrication process for forming gate structures and electrodes on one main surface of a semiconductor substrate and thereafter applying abrasion processing by polishing/rubbing techniques to the other main surface to thereby form the semiconductor substrate to a desired thickness, the thinner the substrate, the lower the physical strength of such substrate. A decrease in substrate strength would result in this substrate changing in shape to exhibit unwanted deformation due to the concavo-convex surface irregularity on the one main surface of the semiconductor substrate-that is, the step-like surface configuration with the thickness t as created by a surface height difference between the electrode/wiring patterns and the passivation film as formed thereon. If further thinning process is applied to the substrate, then serious problems can occur including accidental cracking. Another problem faced with the device structure when thinly forming the passivation film in order to avoid such substrate crackability is that breakdown voltage defects and electrical shorting failures take place due to an increase in leakage current and a change in electric field distribution as a result of contamination by externally incoming impurities, such as contaminant particles, micro-dusts and the like.

FIGS. 21A and 21B graphically show simulation results of the relationship of substrate crack possibility versus stair step-like surface configuration or irregularity t, wherein the crackability is definable as the possibility that a semiconductor substrate cracks during its micro-grinding process. Note that FIG. 21A demonstrates the crackability versus step-like surface irregularity relation obtained when the substrate measures 150 μm in thickness; FIG. 21B is when the substrate thickness is set at 250 μm. It is apparent from viewing these graphs that as the substrate is made thinner, substrate crack problems occur during micro-grinding processes. Obviously, the greater the step t, the higher the substrate crackability.

SUMMARY OF THE INVENTION

A semiconductor device in accordance with one aspect of this invention includes spaced-apart first and second element formation regions which are formed in a main surface of a semiconductor substrate, a dielectric film which is formed on the main surface of the semiconductor substrate at a location between the first and second element formation regions, first electrode patterns which are formed above the first and second element formation regions respectively and each of which has an end portion extended to overlie the dielectric film, the first electrode patterns being formed by patterning of a first electrode layer, second electrode patterns formed above the first electrode patterns respectively, and a passivation film formed above the first electrode patterns to be positioned adjacent to the second electrode patterns while covering part of the dielectric film which is exposed during patterning of the first electrode layer.

A semiconductor device in accordance with another aspect of the invention includes diffusion regions formed in a main surface of a semiconductor substrate, a dielectric film which is formed on or above the main surface of the semiconductor substrate and which has contact holes leading to the diffusion regions, first electrode patterns which are in contact with the diffusion regions through the contact holes and which have end portions extending above the dielectric film, second electrode patterns which are formed above the first electrode patterns, and a passivation film which is formed directly on the dielectric film and the first electrode patterns.

A semiconductor device in accordance with a further aspect of the invention includes a semiconductor substrate, a cell which includes the semiconductor substrate as its structural component and functions as at least one of a semiconductor circuit element and a semiconductor switch, a barrier metal which is formed by patterning of a metal layer and which becomes a structural component of an electrode pattern of the cell; a dielectric film placed between the semiconductor substrate and the barrier metal, a conductive pattern which is formed above the barrier metal while being exposed to outside and becoming a structural component of the electrode pattern of the cell, and a passivation film which is formed to cover or coat the dielectric film as exposed during patterning of the metal layer and also to locate in close proximity to the conductive pattern over the barrier metal.

DETAILED DESCRIPTION OF THE INVENTION

Several embodiments of the present invention will now be explained in detail with reference to the accompanying drawings below.

(First Embodiment)

Figure 1:
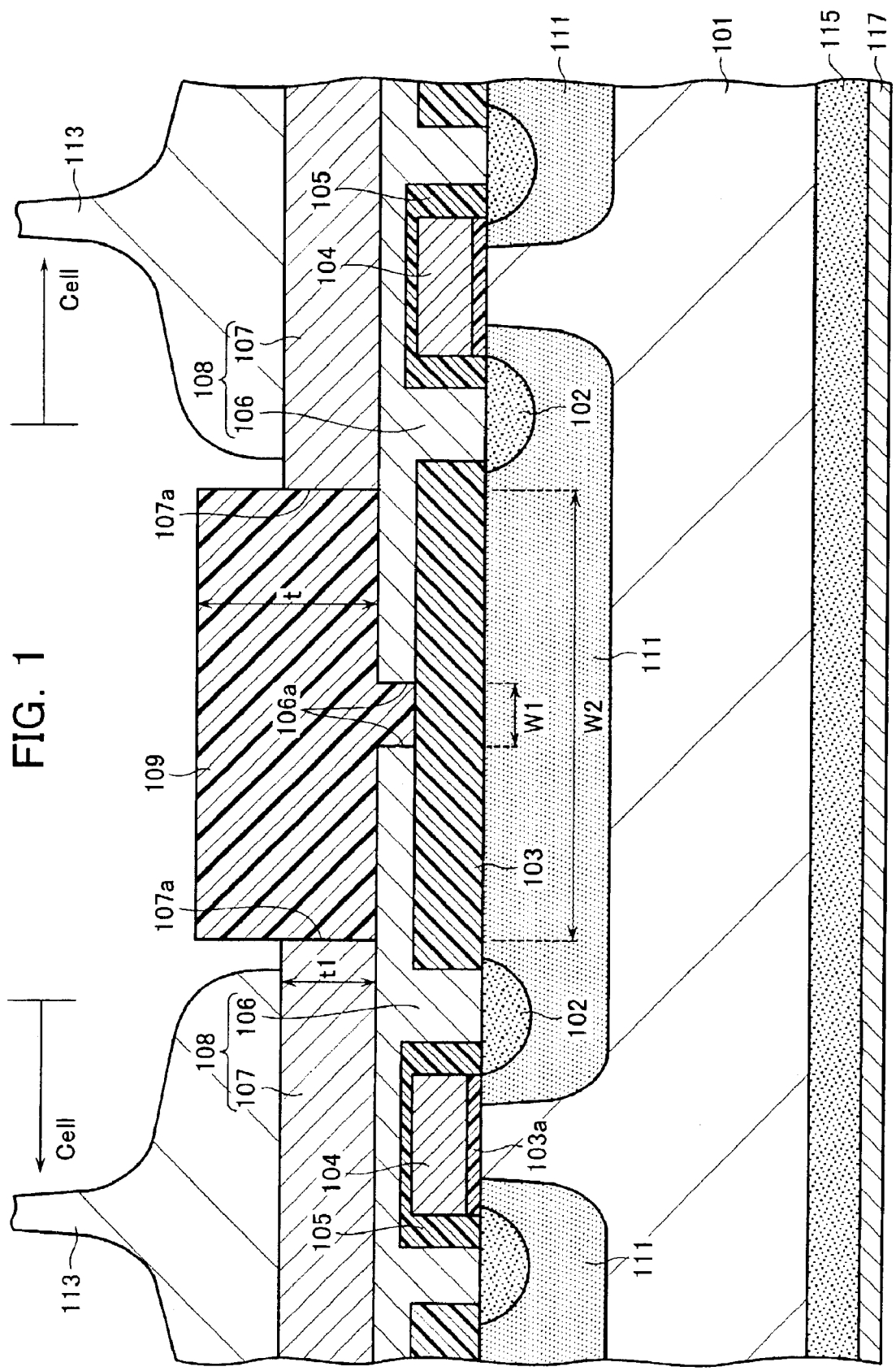
FIG. 1 is a diagram showing a cross-sectional view of main part of a semiconductor device in accordance with a first embodiment of the present invention.

FIG. 1 illustrates, in cross-section, main part of a semiconductor device having on-chip cells in accordance with one embodiment of the present invention. Note here that the cell structure shown herein is a mere example and should not be regarded as the one that specifically limits the invention. Each cell includes a semiconductor substrate 101 as its constituent or structural component and functions as at least one of a semiconductor integrated circuit element and a semiconductor switch.

The semiconductor substrate 101 is of heavily-doped P (P$^+$) type conductivity and has one principal or main surface in which element formation regions 111 of, for example, P type conductivity are provided. Each region 111 is for use as a P-type base region. In this region 111, laterally spaced-apart element formation regions 102 of first and second cells are formed. Each region 102 is for use as a N-type source region. An electrically insulative or dielectric film 103 is formed on the semiconductor substrate 101. The dielectric film 103 is a silicon oxide film or the like, by way of example. Selected portions of dielectric film 103 which overlie element formation regions 102 are removed away by etching in order to form therein electrical contacts. In other words, contact holes are defined in dielectric film 103 for permitting exposure of the element formation regions 102 that are diffusion regions. Additionally a gate electrode 104 made of polycrystalline silicon or polysilicon or else is formed on the gate insulator film 103a within the individual cell. The gate electrode 104 has its sidewalls and upper portion on which an interlayer dielectric film 105 (for example, silicon oxide film) is formed.

On the element formation region 102 of each cell, a first electrode pattern 106 made of a first conductive material such as titanium or the like and a second electrode pattern 107 made of second conductive material such as aluminum, copper or else are stacked or laminated to thereby form a multilayer electrode pattern 108. An electrical wire 113 made of gold or else is coupled by bonding techniques to the electrode pattern 108. The wire 113 is electrically connected to a lead frame, not shown. Optionally a structure may alternatively be used, which is arranged so that a metal plate made of aluminum or else is adhered to the electrode pattern 108 in place of the wire 113, wherein this metal plate is connected to the lead frame.

Between the neighboring cells, first electrode patterns 106 are formed to have their opposing terminate end portions, which extend to overlie the dielectric film 103 respectively so that a first groove 106a having a first width W1 is formed between these electrode pattern ends. In addition, second electrode patterns 107 have a second groove 107a between their terminate ends. This second groove is formed to have a second width W2 that is greater than the width W1 of first groove 106a to thereby permit exposure of the ends of the underlying first electrode patterns 106.

The first conductive material may typically be titanium (Ti), titanium-tungsten (TiW) or other similar suitable materials. The material functions as a barrier metal for reducing or suppressing unwanted diffusion of its overlying second conductive material into the semiconductor substrate 101.

A passivation film 109 with a predetermined thickness is buried in the first groove 106a and second groove 107a between the ends of electrode patterns 108 of the neighboring cells. This passivation film 109 covers or coats an exposed portion of the dielectric film 103 within the first groove 106a and also exposed portions of first electrode patterns 106 within second groove 107a. In other words the passivation film 109 is formed directly on the dielectric film 103 and first electrode patterns 106. Passivation film 109 is a dielectric film (e.g. resin film) as formed atop the semiconductor device. Passivation film 109 is formed in order to prevent undesired ionization of water components attached to the dielectric film 103, thereby avoiding bad influenceability upon device characteristics and circuit element destruction otherwise occurring due to unwanted electrical shortcircuiting. Typical examples of passivation film 109 are a polyimide film and silicon oxide film.

A element formation region 115, such as an N-type drain region, is provided on the other main surface of the semiconductor substrate 101. On this element formation region 115, an electrode pattern 117 is formed such as gold or else. The electrode pattern 117 is for use as a drain electrode—or may sometimes be a source electrode—in case the cell is a metal oxide semiconductor field effect transistor (MOSFET); alternatively, electrode pattern 117 becomes a collector electrode in the case of an insulated gate bipolar transistor (IGBT).

Figure 2:
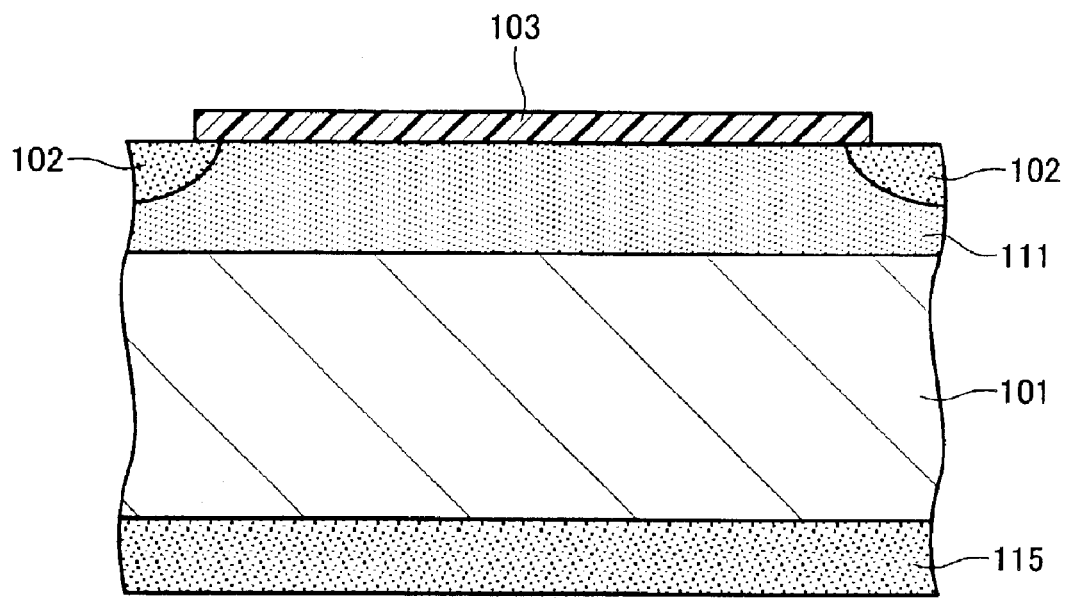
FIG. 2 is a main-part sectional diagram showing one process step of a method of fabricating the semiconductor device in accordance with the first embodiment of this invention.

A detailed explanation will next be given of a fabrication method of the semiconductor device in accordance with this embodiment with reference to FIGS. 2 to 5 below. Regarding the cell structures, only their main portions are depicted with the remaining portions omitted herein. Firstly as shown in FIG. 2, fabricate on one main surface of semiconductor substrate 101 a dielectric film (not shown) such as an oxide film for use as gate insulator films of MOS-structured semiconductor circuit elements. Then, form thereon gate electrodes, which are not visible in FIG. 2. Subsequently, selectively remove by etch techniques those portions of a dielectric film 103 which are formed on surface areas in which element formation regions 102 will be later formed. Thereafter, introduce thereinto an impurity of specified conductivity type by doping/implant techniques, thereby forming the intended element formation regions 102 so that these are laterally spaced apart from each other in region 111.

Figure 3:
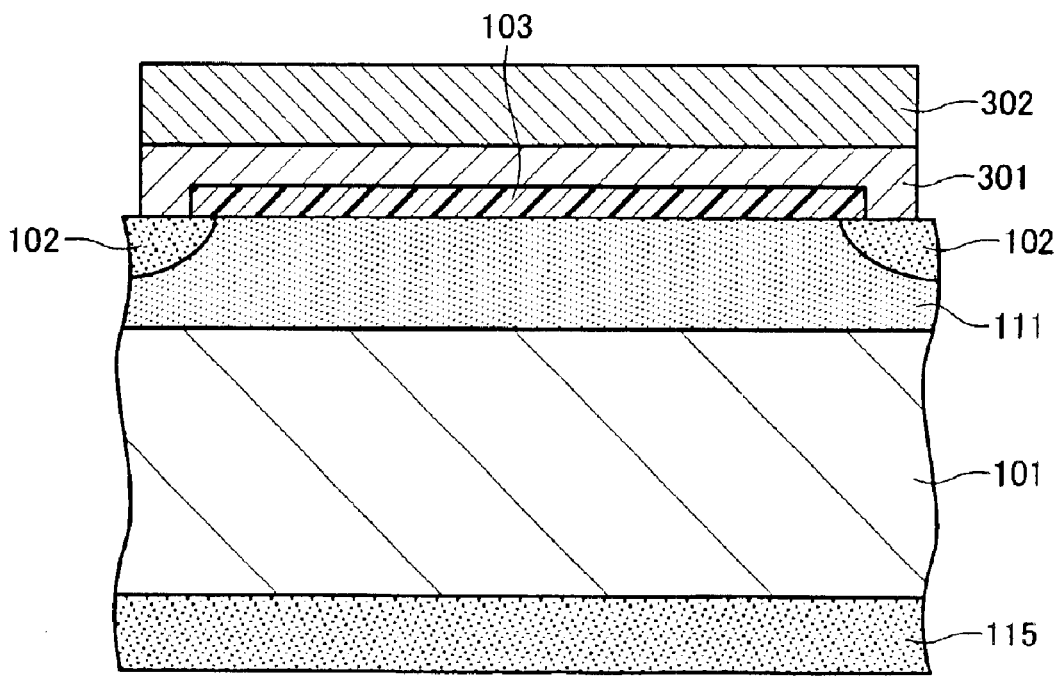
FIG. 3 is a main-part sectional diagram showing one step of the fabrication method of the semiconductor device in accordance with the first embodiment of the invention.

Next, as shown in FIG. 3, stack or laminate on the element formation regions 102 and dielectric film 103 a first electrode layer 301 made of titanium or the like and a second electrode layer 302 made of aluminum or else.

Figure 4:
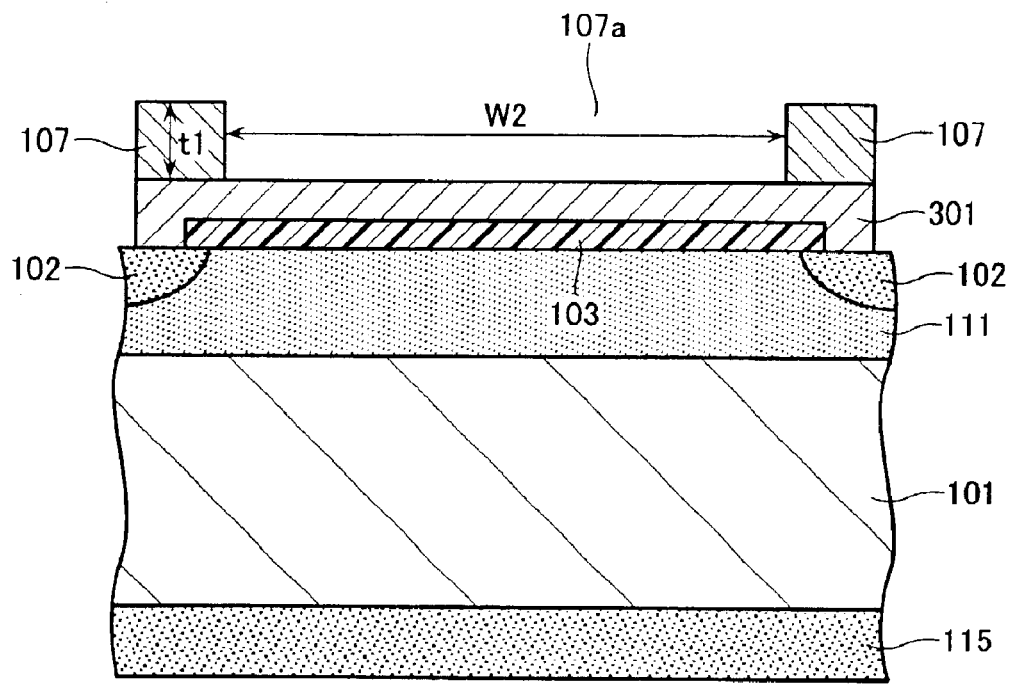
FIG. 4 is a main-part sectional diagram showing one step of the fabrication method of the semiconductor device in accordance with the first embodiment of the invention.

Next as shown in FIG. 4, etch the second electrode layer 302 to form second electrode patterns 107 to a predetermined thickness t1. These electrode patterns 107 have a second groove 107a with a width W2.

Figure 5:
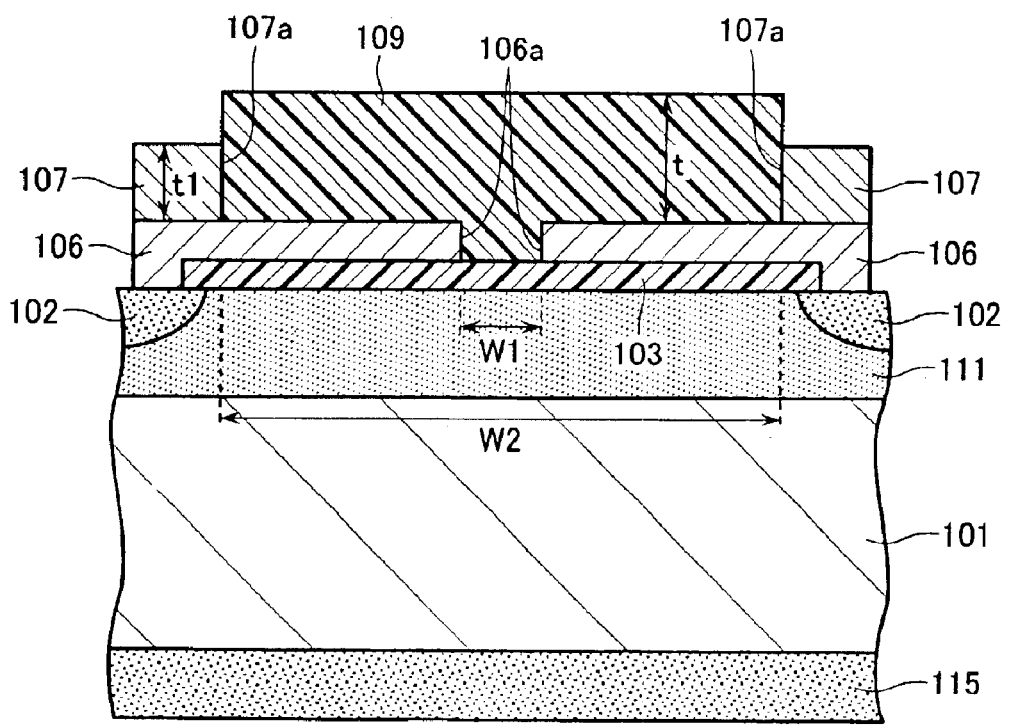
FIG. 5 is a main-part sectional diagram showing one step of the fabrication method of the semiconductor device in accordance with the first embodiment of the invention.

Next as shown in FIG. 5, etch an intermediate or "midway" portion of the first electrode layer 301 which is exposed within the second groove 107a in such a manner as to permit partial exposure of the dielectric film 103, thereby forming first electrode patterns 106 having a first groove 106a with a width W1.

More specifically, fabrication is done so that the width W2 (second width) of second groove 107a of second electrode patterns 102 is greater than the width W1 (first width) of first groove 106a of first electrode patterns 106. The first electrode patterns 106 and second electrode patterns 107 may preferably be made in combination of chosen materials exhibiting large selection ratios in etching processes—typically, Ti and Al, or TiW and Al. The etching order of these electrode patterns is not specifically limitative. It is also permissible that at the step shown in FIG. 4, both the first electrode layer 301 and the second electrode layer 302 are etched at a time to form an opening which is the same in size as the first groove 106a of first electrode patterns 106; and, thereafter, only the patterned edge portions of its overlying second electrode layer 302 are further etched away in such a way that the underlying first electrode layer 301's patterns (first electrode patterns) are partly exposed, thus forming the second electrode patterns 107 having the second groove 107a.

In the way stated above, the first electrode patterns 106 are formed by pattering of the first electrode layer 301 that is a metal layer. Each pattern 106 functions as a barrier metal which becomes a structural component of the cell electrode pattern 108 associated therewith. The individual second electrode pattern 107 becomes a conductive pattern which is formed on its associated first electrode pattern 107 that is a barrier metal so that it is exposed to the outside.

Thereafter, form a passivation film 109 such as a polyimide or silicon nitride film within the first groove 106a and second groove 107a. This film 109 is formed so that it covers the exposed part of dielectric film 103 when patterning the first electrode layer 301 (metal layer) and it locates adjacent to the second electrode patterns 107 on the first electrode patterns 106 (barrier metal). The passivation film 109 is formed in order to preclude unwanted ionization of water components attached to the dielectric film 103, thereby avoiding bad influenceability upon the device characteristics and circuit element destruction otherwise occurring due to accidental electrical shortcircuiting.

Thereafter, polish the back surface of the semiconductor substrate and then form element formation regions and electrodes required. This process is done by chemical mechanical polish (CMP) methods, which are suitable for micro-grinding the substrate to a much reduced thickness of about ⅓ to ¼ of its initial thickness, thereby providing a ultrathin substrate. As apparent from the foregoing explanation, the above-stated fabrication method includes the process steps (a) through (h) which follow.

(a) A step of forming spaced-apart element formation regions of first and second cells in a first main surface of a semiconductor substrate.

(b) A step of forming a dielectric film on or above the first main surface of the semiconductor substrate at a location between the first and second cells.

(c) A step of forming first electrode patterns above the element formation regions of the first and second cells respectively so that these patterns have their opposing terminate end portions each extending onto the dielectric film and also have a first groove with a first width between the end portions.

(d) A step of forming second electrode patterns on the first electrode patterns respectively so that the second patterns have between their end portions a second groove with a second width greater than the first width to thereby permit the first patterns to be partially exposed at upper surface portions thereof.

(e) A step of forming a passivation film which buries the first groove and also at least part of the second groove.

(f) A step of polishing or rubbing a second main surface of the semiconductor substrate.

(g) A step of forming another element formation region in the second main surface of the semiconductor substrate.

(h) A step of forming another electrode pattern on the another element formation region.

Figure 6:
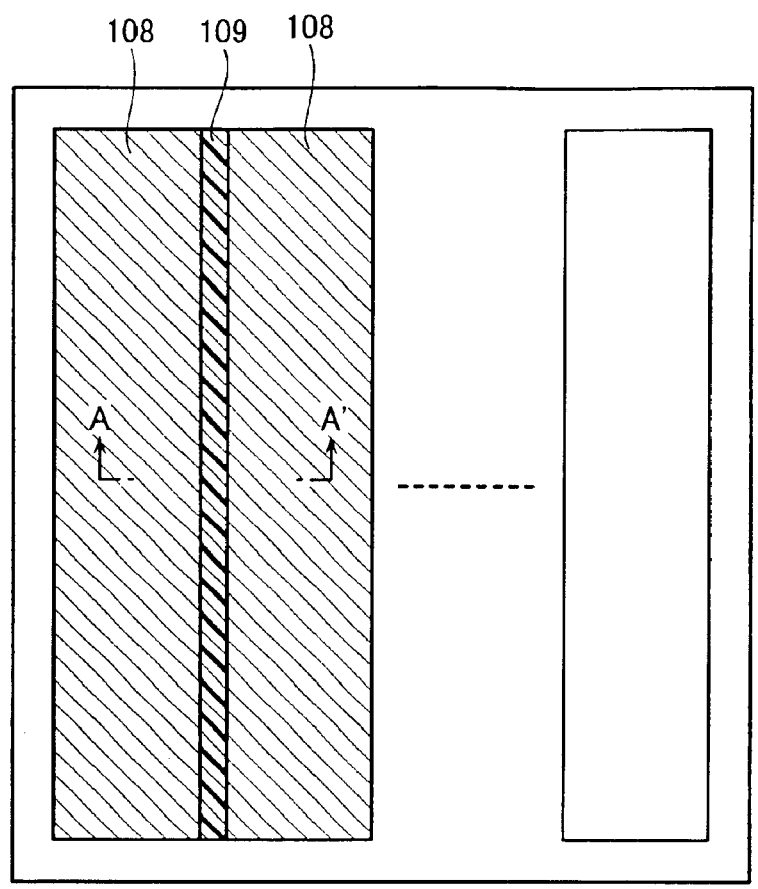
FIG. 6 is a plan view of main part of the semiconductor device in accordance with the first embodiment of the invention.

FIG. 6 depicts a plan view of a semiconductor device having cells. Its electrode patterns 108 and passivation film 109 are laid out so that these are substantially in parallel with each other. Note that FIG. 1 is a cross-sectional view of this device structure as taken along line A–A' of FIG. 6.

In this way, the semiconductor device of this embodiment is arranged to form the second groove of second electrode patterns in such a manner that this groove has its width W2 greater than the width W1 of the first groove of first electrode patterns and includes the first groove to thereby permit exposure of the end portions of first electrode patterns while letting a passivation film be buried in these first and second grooves.

With such an arrangement, the passivation film that was formed on the first electrode patterns including the dielectric film within the first groove has a prespecified thickness value t and thus retains the functionality of passivation film. And, a stair step-like surface configuration or irregularity which is created by a surface height difference between the passivation film on the first electrode patterns and the second electrode pattern is lessened to t–t1. Thus it is possible to reduce and suppress unwanted deformation and cracking accidents of the substrate otherwise occurring during the process for forming the substrate to a desired thickness while at the same time retaining the inherent functionality of the passivation film.

It should be noted that although the individual second electrode pattern is partially removed away in order to form the passivation film, any possible decrease in electrode area due to this removal hardly affects the device characteristics. This can be said because such partial electrode pattern removal is done merely at a partial area midway between the neighboring cells.

(First Modification)

Figure 7:
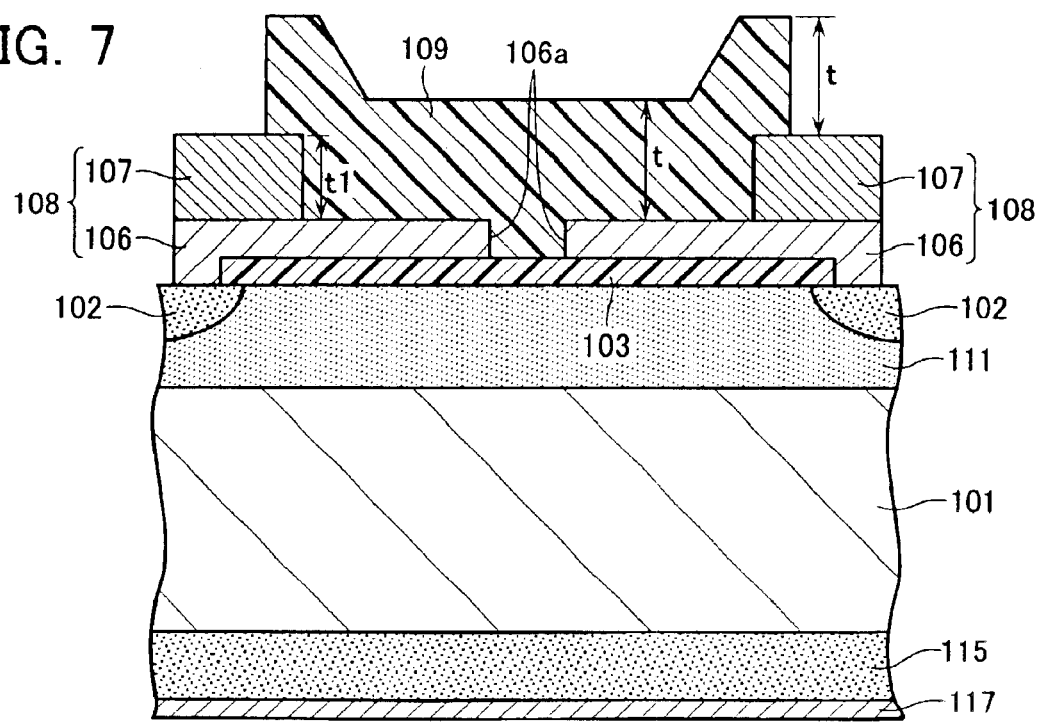
FIG. 7 is a sectional view of main part of a semiconductor device in accordance with a first modified example of the first embodiment of the invention.

FIG. 7 shows a semiconductor device in accordance with a first modified example of the first embodiment. In this modification, the passivation film 109 is formed so that its side edge portions further extend onto the second electrode patterns 107 to thereby have a "U"-like profile. The remaining structural features of it is the same as those of the first embodiment stated supra; thus, an explanation thereof will be omitted herein.

In this way, in the semiconductor device of the first modification, the passivation film 109 overlying the first electrode patterns 106 including the part of dielectric film 103 within the first groove 106a has a prespecified thickness t and retains the functionality of passivation film. And, the step-like surface configuration that is created by the height difference between the passivation film 109 on first electrode patterns 106 and the second electrode patterns 107 is lessened to t−t1. Accordingly as in the first embodiment, it is possible to reduce substrate deformability and crackability while at the same time retaining the passivation film functionality required.

Note here that although a step-like surface configuration with a height difference equal to the value t is created by the second electrode pattern and the passivation film thereon at each of the portions of the passivation film which are formed to extend onto the second electrode patterns, this hardly leads to deformation and/or cracking of the substrate because of the fact that this area with such greater step-like surface difference t is extremely small and has a step-like difference relative to the other passivation film portion. Another advantage of this modification is that fabrication of the passivation film is relatively easy.

(Second Modification)

Figure 8:
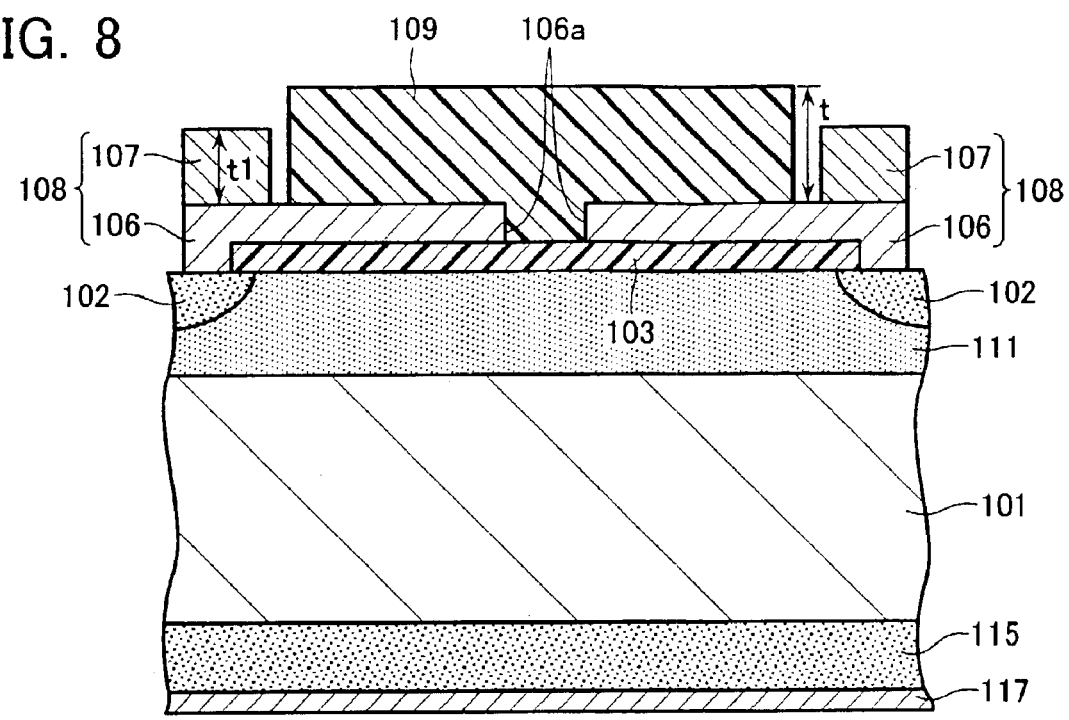
FIG. 8 is a sectional view of main part of a semiconductor device in accordance with a second modification of the first embodiment of the invention.

FIG. 8 shows a semiconductor device in accordance with a second modified example of the first embodiment. In this modification the device is formed to have narrow openings or gaps between the opposite sidewalls of passivation film 109 and their associated edge walls of second electrode patterns 107, thereby causing exposure of corresponding upper surface portions of the first electrode patterns 106. The other structural arrangements are the same as those of the first embodiment so that an explanation thereof is omitted herein.

In the semiconductor device of the second modification also, the passivation film 109 overlying the first electrode patterns 106 including the dielectric film 103 within the first groove 106a has a predetermined thickness t and thus retains the passivation film functionality. And, the step-like surface difference that is created by the passivation film 109 on first electrode patterns 106 and the second electrode patterns 107 is lessened to t−t1. Accordingly as in the first embodiment, it is possible to reduce substrate deformability and crackability. Incidentally, the presence of the gaps defined between the passivation film sidewalls and the side edge walls of second electrode patterns hardly leads to the loss of passivation functionality because upper surfaces of those portions of the first electrode patterns in close proximity to the dielectric film within the first groove are covered or coated with the passivation film of the specified thickness. And, with this modification, it is possible to fabricate the passivation film while reducing complexities in the manufacturing process thereof.

Figure 9:
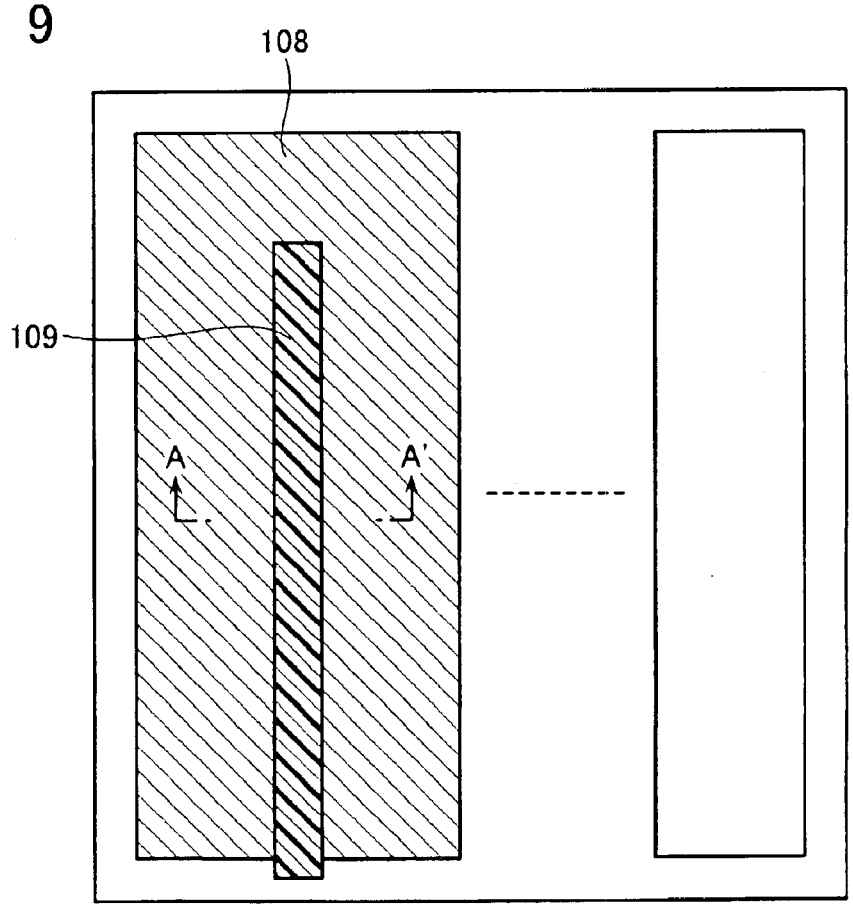
FIG. 9 is a plan view of main part of a semiconductor device in accordance with another example of the first to third embodiments of the invention.
Figure 10:
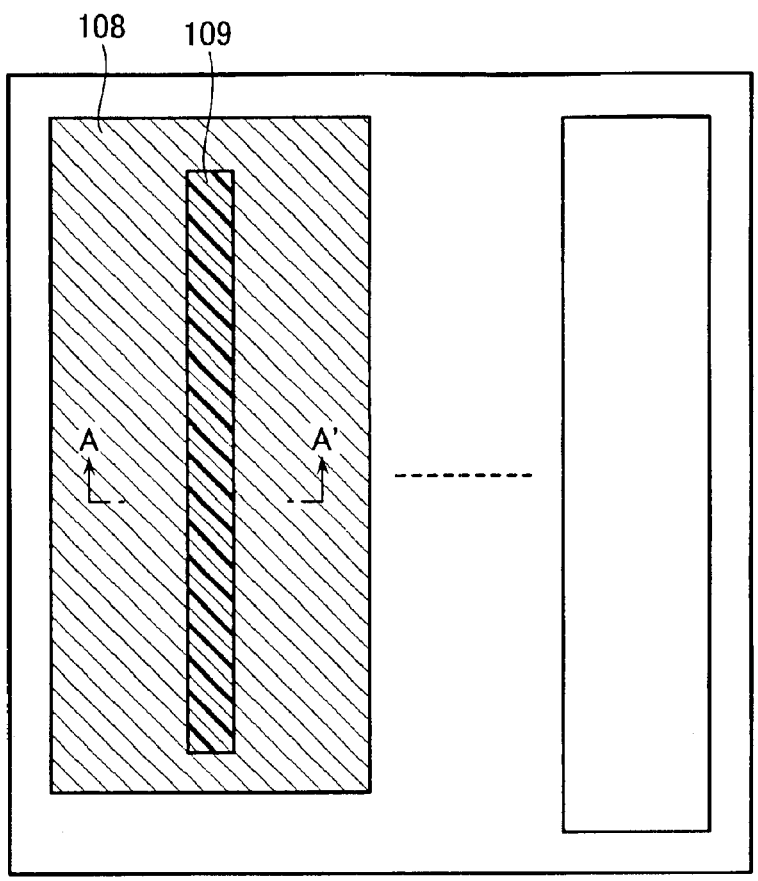
FIG. 10 is a plan view of main part of a semiconductor device in accordance with another example of the first to third embodiments of the invention.

Although in the first embodiment and its first and second modifications the electrode patterns and passivation film as used therein are arranged so that these are in parallel and also parallel-disposed by way of example, an electrode pattern 108 shown in FIG. 9 is alternatively employable. This electrode pattern 108 is such that either the first electrode patterns 106 on the both sides of the first groove or the second electrode patterns 107 on the both sides of second groove are coupled together in another region. A further altered example is shown in FIG. 10, wherein the first and second electrode patterns 106–107 have a hollow rectangular or ring-like planar shape. Although typical examples of the cell structure are vertically structured or "vertical-access" semiconductor circuit elements including but not limited to trench type MOSFETs and trench IGBTS, the invention should not specifically be limited only to such vertical semiconductor integrated circuit elements.

(Second Embodiment)

Figure 11:
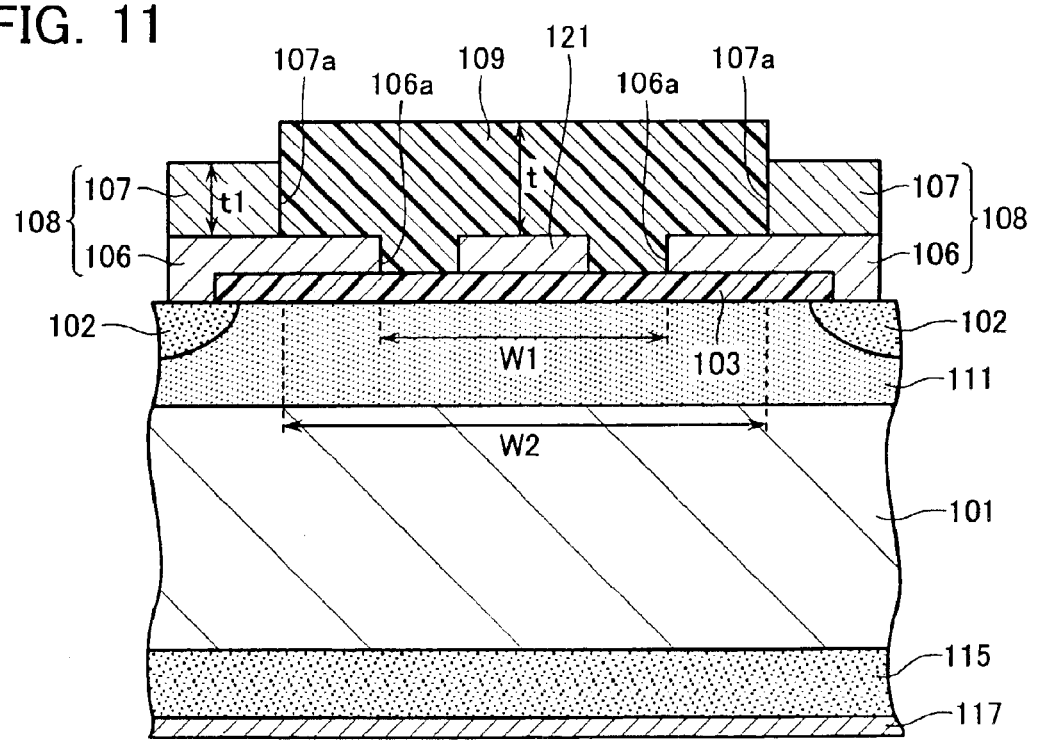
FIG. 11 is a sectional view of main part of a semiconductor device in accordance with a second embodiment of the invention.

FIG. 11 is a cross-sectional view of main part of a semiconductor device with on-chip cells in accordance with a second embodiment of the invention. Note here that only portions of the cell structures are depicted herein. The same reference characters are used to denote the same parts or components as those shown in FIG. 1, and a detailed explanation thereof is omitted.

An electrical wiring pattern 121 is formed on the dielectric film 103 at its exposed portion within the first groove 106a between the terminate ends of first electrode patterns 106. The wiring pattern 121 is made, for example, of the same conductive material as the first electrode patterns 106. The wiring pattern 121 is centrally located within the first groove 106a on dielectric film 103 to thereby divide this groove into a plurality of grooves, that is, two grooves in the illustrative embodiment. Here, the wiring pattern 121 should not specifically be limited to using the same conductive material as that of the first electrode patterns 106 which are underlayer electrodes.

A passivation film 109 with a predetermined thickness is buried in the first groove 106a and second groove 107a between the terminate ends of electrode patterns 108 at a location between the cells. This passivation film 109 covers the portions of dielectric film 103 within the first groove 106a that has been divided into plural grooves along with the exposed portion of wiring pattern 121 within the second groove 107a and edge portions of first electrode patterns 106. The passivation film 109 is formed in order to preclude unwanted ionization of water components attached to the dielectric film 103, thereby avoiding bad influenceability upon the device characteristics and circuit element destruction otherwise occurring due to electrical shorting. Passivation film 109 is formed of a polyimide film or silicon oxide film.

Figure 12:
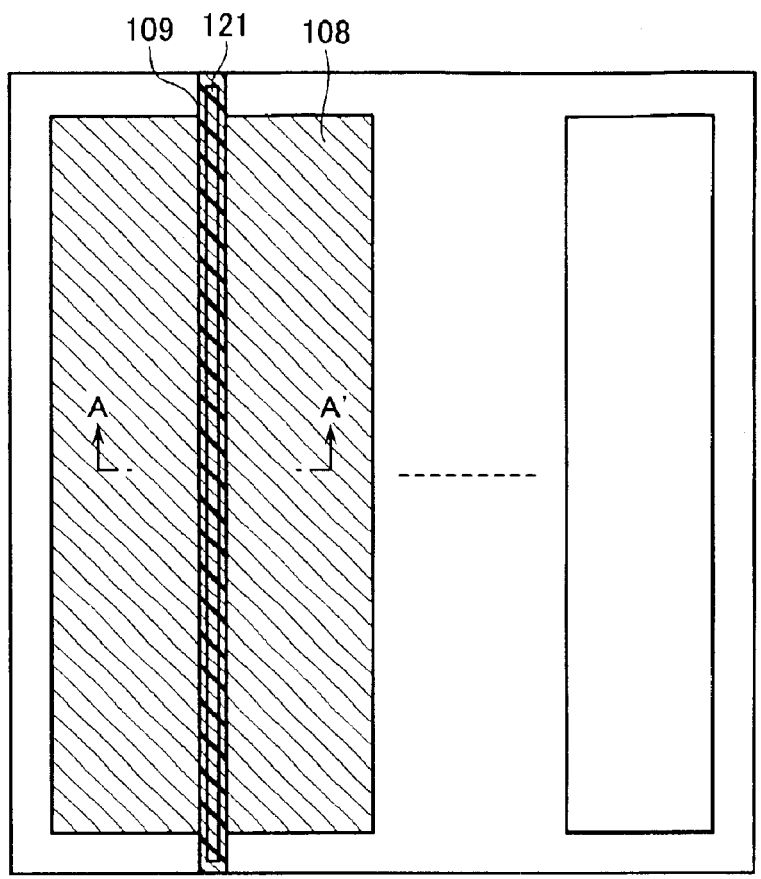
FIG. 12 is a plan view of main part of the semiconductor device in accordance with the second embodiment of the invention.

FIG. 12 is a plan view of the semiconductor device having cells. The electrode patterns 108 and the passivation film 109 are disposed to extend in parallel to each other. The wiring pattern 121 is formed between electrode patterns 108. The cross-sectional view shown in FIG. 11 is that taken along line A–A' of FIG. 12.

As apparent from the foregoing, the semiconductor device of this embodiment is arranged so that the second groove of second electrode patterns is formed to have its width greater than the width of the first groove to thereby include the plurality of first grooves as formed by the first electrode patterns and the laterally intermediate wiring pattern while exposing the terminate ends of first electrode patterns, with the passivation film buried in these first and second grooves. Due to this, the passivation film which was formed to overlie the first electrode patterns including the dielectric film components within the plural first grooves has a prespecified thickness t and thus maintains the functionality of passivation film. And, the step-like surface difference that is created by the passivation film on first electrode patterns and the second electrode patterns is lessened to t−t1. Thus it is possible to reduce problems as to substrate deformability and crackability at the process step of forming the substrate to a desired thickness while simultaneously retaining the passivation film functionality.

It must be noted that although the second electrode patterns and the wiring pattern are partially removed away in order to form the passivation film, a decrease in electrode area due to this removal hardly affects the device characteristics.

(First Modification)

Figure 13:
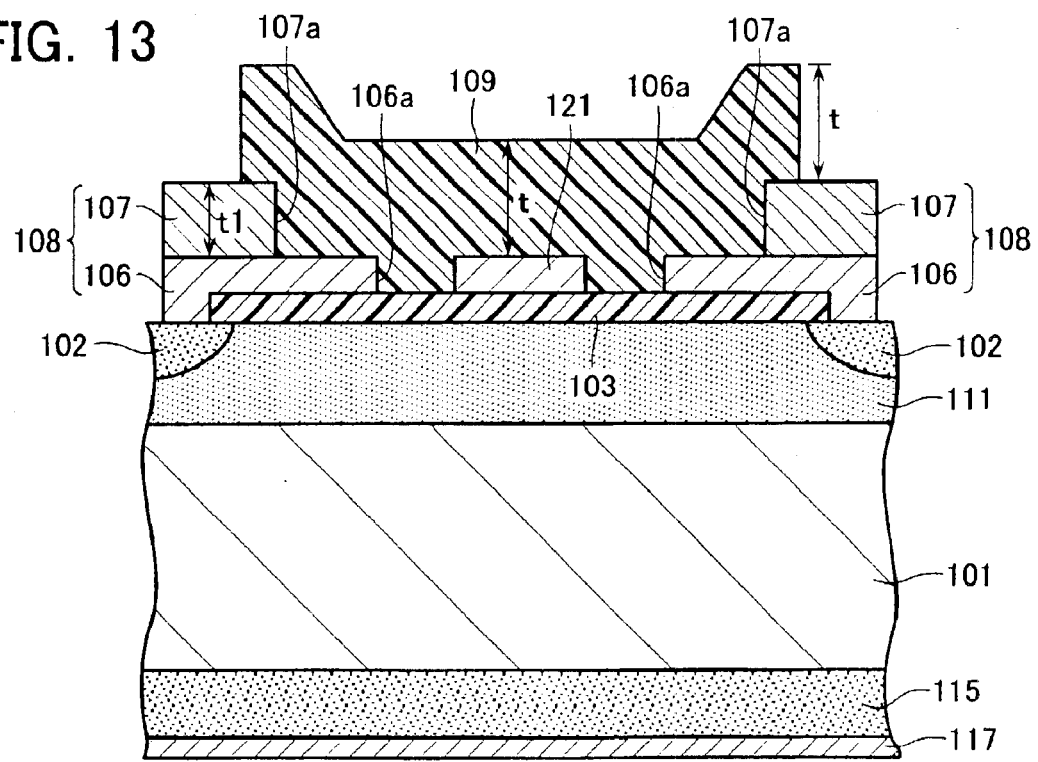
FIG. 13 is a sectional view of main part of a semiconductor device in accordance with a first modification of the second embodiment of the invention.

FIG. 13 shows a semiconductor device in accordance with a first modified example of the second embodiment. In this modification, side edge portions of the passivation film 109 are formed to extend onto the second electrode patterns 107. The other structural arrangements of it are the same as those of the second embodiment stated supra and thus an explanation thereof is omitted herein.

In this way, in the semiconductor device of the first modification, the passivation film 109 overlying the first electrode pattern 106 including the dielectric film within the divided first grooves 106a has a prespecified thickness t and thus retains the passivation film functionality. And, the step-like surface difference that is created by the passivation film 109 on first electrode patterns 106 and the second electrode patterns 107 is made smaller to t–t1. Accordingly as in the second embodiment, it is possible to reduce or minimize unwanted substrate deformability and crackability while at the same time maintaining the passivation film functionality required.

Note here that although a step-like surface height difference t is created by the second electrode pattern and its overlying passivation film at each of the portions of the passivation film which are formed to extend onto the second electrode patterns, this hardly results in deformation and/or cracking accidents of the substrate because of the fact that the area with this step-like difference t is extremely small in size and also has a step-like difference relative to the other passivation film portion. Additionally with this modification, the passivation film is relatively easily formable.

(Second Modification)

Figure 14:
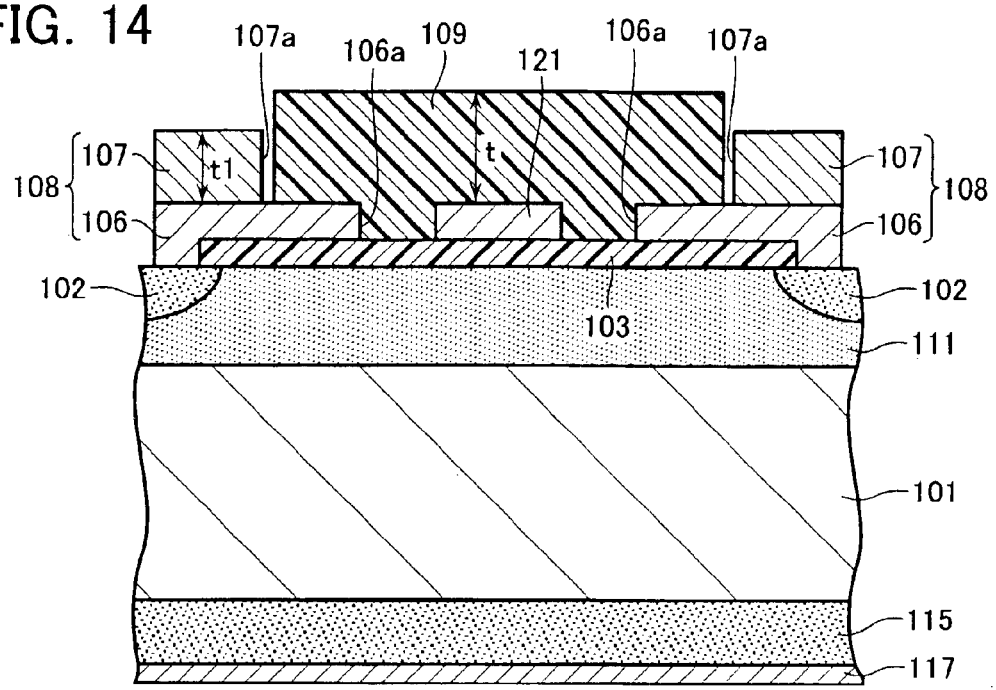
FIG. 14 is a sectional view of main part of a semiconductor device in accordance with a second modification of the second embodiment of the invention.

FIG. 14 shows a semiconductor device in accordance with a second modified example of the second embodiment. In this modification the device is formed to have narrow gaps between the sidewalls of passivation film 109 and their associated edge walls of second electrode patterns 107, thereby causing exposure of corresponding upper surface portions of first electrode patterns 106. The other structural arrangements are the same as those of the second embodiment; so, an explanation thereof is omitted here.

In the semiconductor device of the second modification also, the passivation film 109 overlying the first electrode patterns 106 involving the dielectric film 103 within the first grooves 106a has a predetermined thickness t and thus retains the passivation film functionality. And, the step-like surface difference that is created by the passivation film 109 on first electrode pattern 106 and the second electrode pattern 107 is lessened to t–t1. Accordingly as in the second embodiment, it is possible to reduce substrate deformability and crackability.

Incidentally, the presence of the narrow gaps defined between the passivation film sidewalls and the walls of end portions of second electrode patterns hardly leads to the loss of passivation functionality because upper surfaces of the portions of first electrode patterns adjacent to the dielectric film within the first grooves are covered with the passivation film having the specified thickness. And, with this modification, the passivation film is relatively easy in fabrication.

Although in the second embodiment and its first and second modified examples the electrode patterns and passivation film plus wiring pattern as used therein are arranged so that these are in parallel and also parallel-disposed by way of example, another electrode pattern similar to that shown in FIG. 9 in the first embodiment is alternatively employable, wherein either the first electrode patterns on the both sides of the first groove or the second electrode patterns on the both sides of second groove are coupled together in another region. Further as shown in FIG. 10, the first and second electrode patterns have a rectangular ring-like planar shape. The cell structure may be trench-type MOSFETs or trench IGBTs or else with no specific limitation thereto.

(Third Embodiment)

Figure 15:
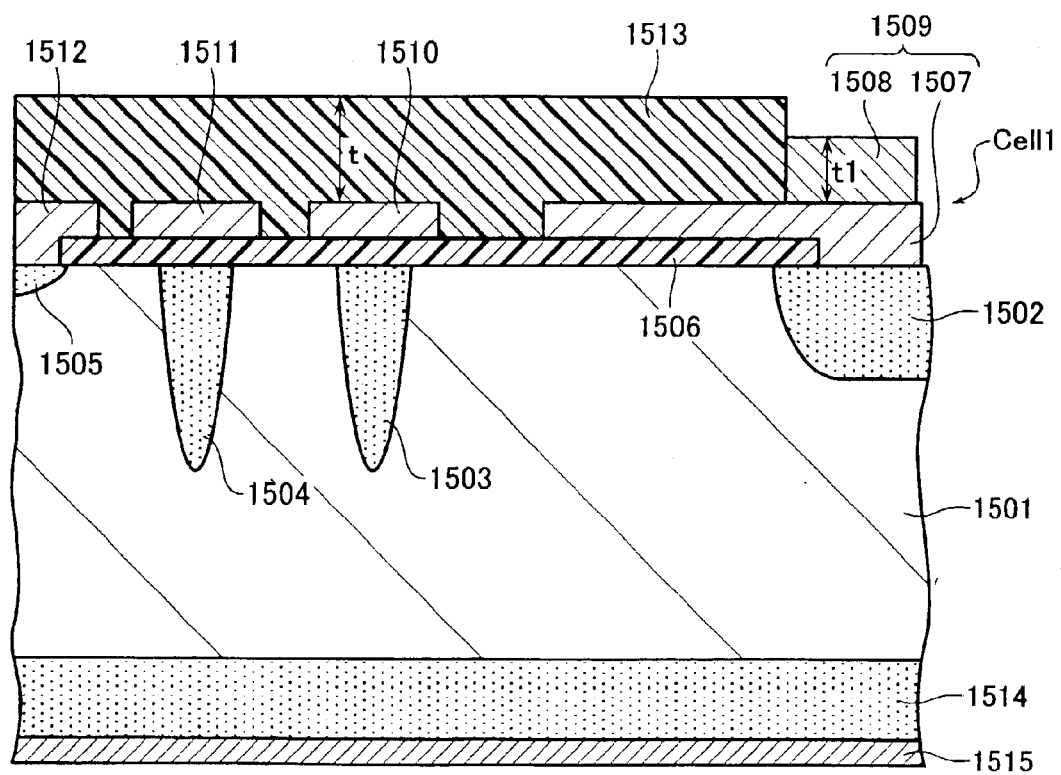
FIG. 15 is a sectional view of main part of a semiconductor device in accordance with a third embodiment of the invention.

FIG. 15 is a sectional view of part of a semiconductor device in accordance with a third embodiment of the invention, which part includes on-chip cells and a terminate end portion of the semiconductor device. Note here that the cell structure shown herein is mere exemplary and should not be interpreted as the one that limits the scope of the invention. The semiconductor device of FIG. 15 is arranged to have a structure with repeated layout of a plurality of cells and also have a terminate end cell (cell1) which is one of the plural cells as located at a terminate end of the above-noted structure.

An element formation region 1502 (first element formation region) is formed at the cell unit (cell1) that acts as the terminate end cell on one main surface of a $P^+$-type semiconductor substrate 1501. This element formation region 1502 is a P-type base region or the like of a MOS structure device, for example. The semiconductor substrate 1501 may alternatively be a pellet. Additionally, at the terminate end portion that is outer periphery of the element formation region 1502, guard ring regions 1503 and 1504 (second element formation regions) are selectively formed. Further, at the periphery thereof, a stopper region 1505 (third element formation region) is selectively formed.

The guard ring regions 1503–1504 are formed in order to increase or expand the width of a depletion layer which is formed when applying a reverse voltage to a semiconductor device such as a power MOSFET or IGBT while at the same time moderating the curvature of a depletion layer boundary to thereby improve the withstanding or breakdown voltage. Optionally these guard rings may be a single one. Depending upon the breakdown level required, no such guard rings may be formed.

The stopper region 1505 is formed at a peripheral portion of the terminate end of the semiconductor substrate 1501 in order to suppress or minimize unwanted spreading of the depletion layer.

A dielectric film 1506, such as for example an oxide film, is formed on the semiconductor substrate 1501. Certain portions of the dielectric film 1506 which overlie the element formation region 1502 and stopper region 1505 are removed away for formation of contacts therein.

On the element formation region 1502, a first electrode pattern 1507 made of a first conductive material such as titanium and a second electrode pattern 1508 made of second conductive material such as aluminum are stacked to thereby form an electrode pattern 1509.

At the cell unit and the terminate end portion, the first electrode pattern 1507 is formed so that its respective end portion extends onto the dielectric film 1506. The second electrode pattern 1508 is such that its end portion is etched away to expose its associated end portion of the underlying first electrode pattern 1507.

The first conducive material may typically be a barrier metal such as Ti, TiW or else. This barrier metal functions to suppress diffusion of the second conductive material being formed thereon into the semiconductor substrate 1501.

Additionally, field plates 1510 and 1511 are selectively formed on the dielectric film 1506 at locations overlying the guard ring regions 1503–1504 at the periphery of first electrode pattern 1507—that is, between the first electrode pattern 1507 and the periphery of semiconductor substrate 1501. For instance the field plates 1510–1511 are made of the same conductive material as that of the first electrode pattern 1507. These field plates are formed in order to potentially stabilize the guard ring regions.

Formed on the stopper region 1505 is a stopper electrode pattern 1512 which is made of the same conductive material as that of the first electrode pattern 1507. This invention should not specifically be limited to the arrangement that the field plates 1510–1511 and stopper electrode pattern 1512 are made of the same conductive material as the first electrode pattern that is the underlayer electrode. What is functionally required for these electrodes is the capability to perform voltage potential supplement. In this viewpoint, these may be made of any currently available conductive materials.

Additionally at a location between the periphery of semiconductor substrate 1501 and the terminate end of second electrode pattern 1508, a passivation film 1513 is formed to overlie exposed surface portions of the dielectric film 1506 among the first electrode pattern 1507 and field plates 1510–1511 and stopper electrode pattern 1512 along with the field plates 1510–1511 and stopper electrode pattern 1512 plus first electrode pattern 1507. The passivation film 1513 may be a polyimide or silicon nitride film or else. More specifically, the passivation film 1513 is formed to neighbor upon the second electrode pattern 1508 (conductive pattern) of the terminate end cell (cell1) at a position overlying the first electrode pattern 1507 (barrier metal) of the end cell. And the passivation film 1513 is formed to cover exposed part of dielectric film 1506 outside the structure with repeated layout or array of multiple cells when forming the first electrode pattern 1507 by patterning of a metal layer.

Another element formation region 1514 such as a drain region is formed in the other main surface of the semiconductor substrate 1501. Another electrode pattern 1515 is formed on the electrode pattern 1514. Setting the electrode pattern 1515 and the stopper electrode pattern 1512 at the same potential makes it possible to suppress unwanted spreading of a depletion layer(s).

Figure 16:
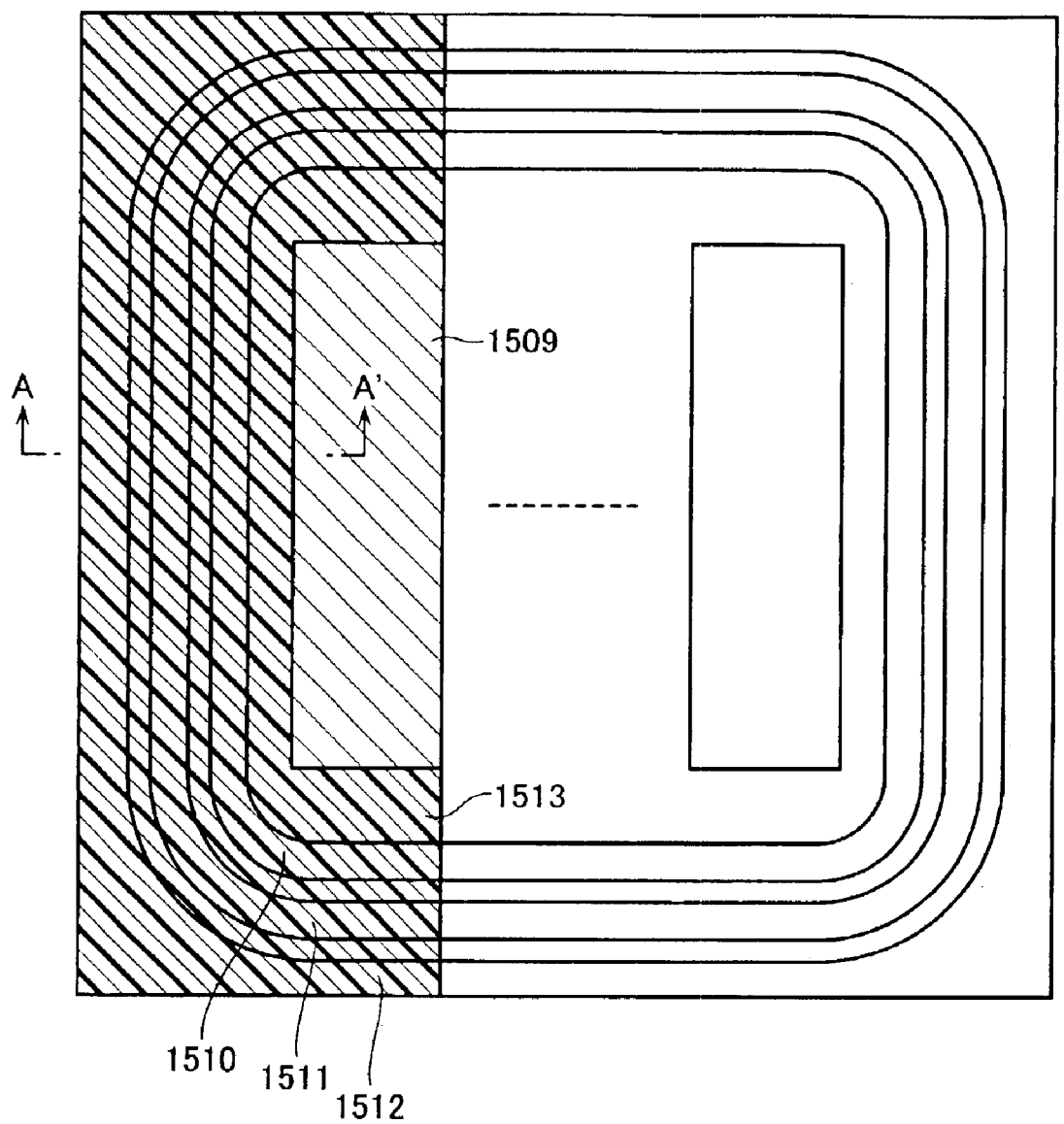
FIG. 16 is a plan view of main part of the semiconductor device in accordance with the third embodiment of the invention.

FIG. 16 is a plan view of part of the semiconductor device including the cell unit and terminate end portion. The field plates 1510–1511 and stopper electrode pattern 1512 are formed at outer periphery of the electrode pattern 1509. The passivation film 1513 is formed to overlie them.

In this way, the semiconductor device of this embodiment is arranged so that the second electrode pattern is formed to expose the end portion of first electrode pattern, the field plates, the stopper electrode pattern and the dielectric film portion between them while forming the passivation film so that it is buried in this exposed portion. With such a structure, the passivation film formed to overlie the first electrode pattern and field plates plus stopper electrode pattern has a predetermined thickness t and thus retains the passivation film functionality. And, the step-like surface difference as created by the passivation film on first electrode pattern and the second electrode pattern is lessened to t–t1. thus it is possible to reduce the substrate deformability and crackability at the process step of forming the substrate to a desired thickness while simultaneously maintaining the passivation film functionality required.

It should be noted that although the second electrode pattern and wiring pattern are partially removed away in order to form the passivation film, a resultant decrease in electrode area hardly affects the device characteristics.

(First Modification)

Figure 17:
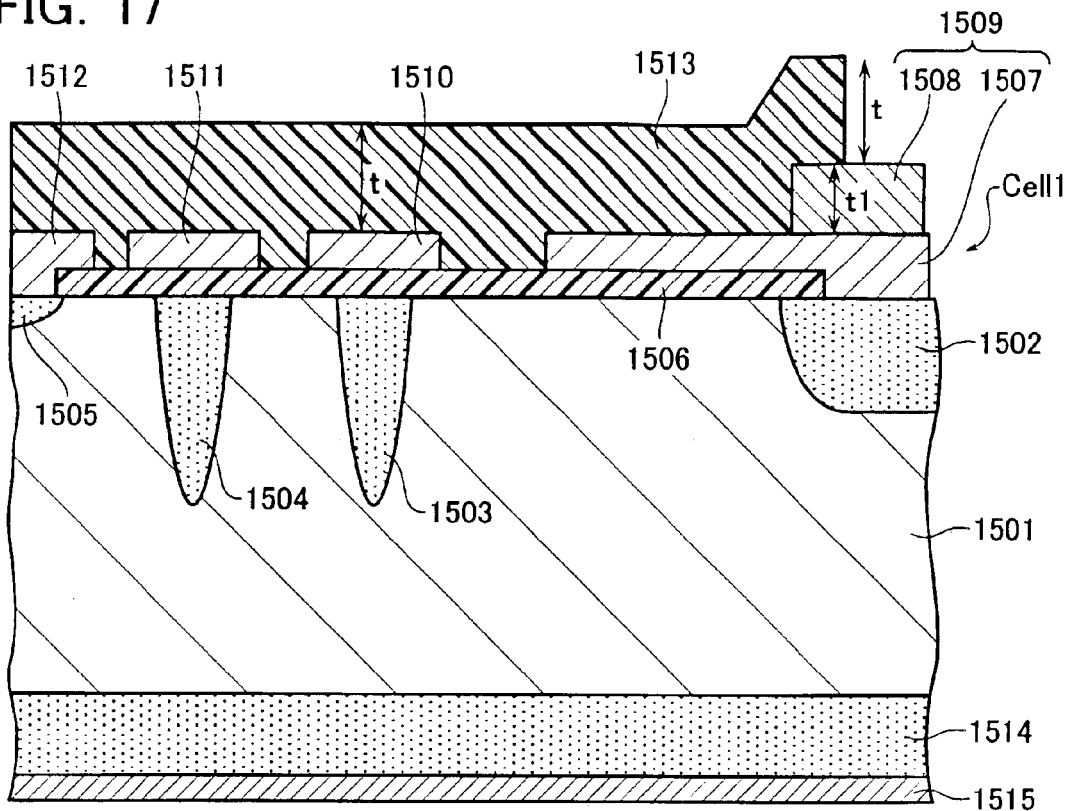
FIG. 17 is a sectional view of main part of a semiconductor device in accordance with a first modification of the third embodiment of the invention.

FIG. 17 shows a semiconductor device in accordance with a first modified example of the third embodiment. In this modification the passivation film 1513 is formed so that its portion extends to ride on the second electrode pattern 1513. The other structural arrangements of it are the same as those of the third embodiment and thus an explanation thereof is omitted herein.

In this way, in the semiconductor device of the first modification also, the passivation film 1513 which overlies the first electrode pattern 1507 and field plates 1510–1511 plus stopper electrode pattern 1512 has a predetermined thickness t and thus maintains the passivation film functionality. And, the step-like surface difference as created by the passivation film 1513 overlying the first electrode pattern 1507 and field plates 1510–1511 plus stopper electrode pattern 1512 and the second electrode pattern 1508 is lessened to t–t1. Accordingly as in the third embodiment, it is possible to reduce the substrate deformability and crackability while at the same time retaining the passivation film functionality. Incidentally, although a step-like surface difference t is created by the second electrode pattern and its overlying passivation film at the portion of passivation film which is formed to extend onto the second electrode pattern, this hardly leads to deformation and/or cracking of the substrate because the area of this step-like difference t is extremely small and also has a step-like difference with respect to the other passivation film portion. Additionally, according to this modification, the passivation film is relatively easy in fabrication.

(Second Modification)

Figure 18:
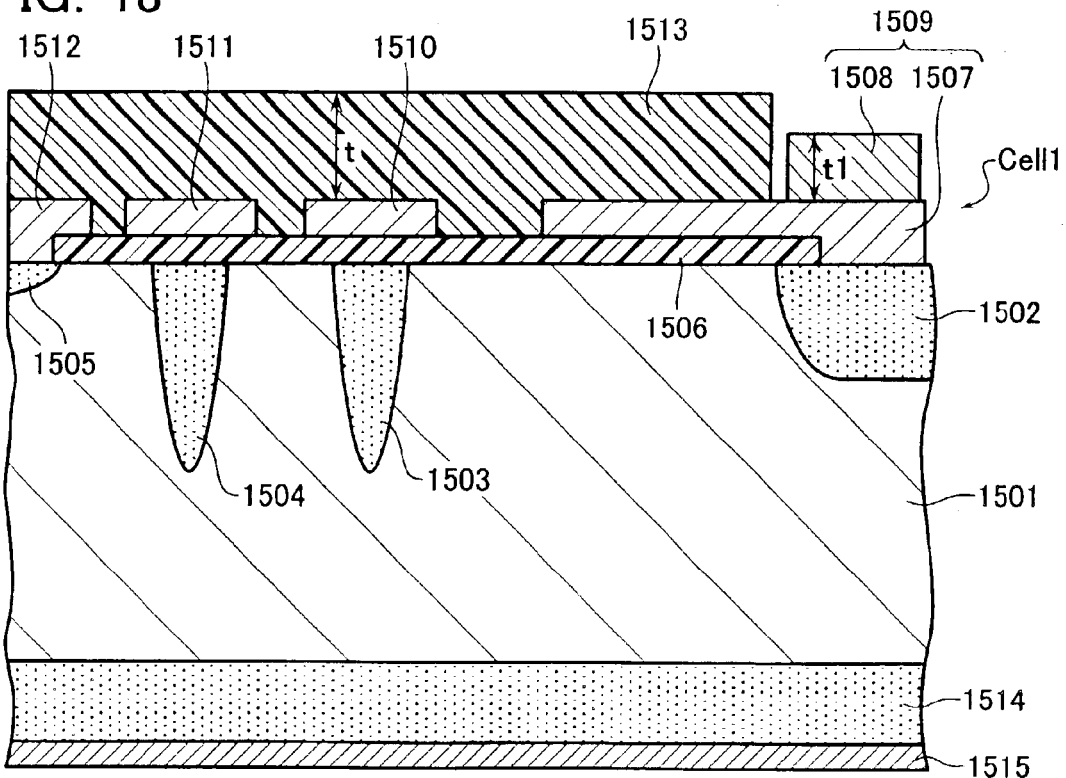
FIG. 18 is a sectional view of main part of a semiconductor device in accordance with a second modification of the third embodiment of the invention.
Figure 19:
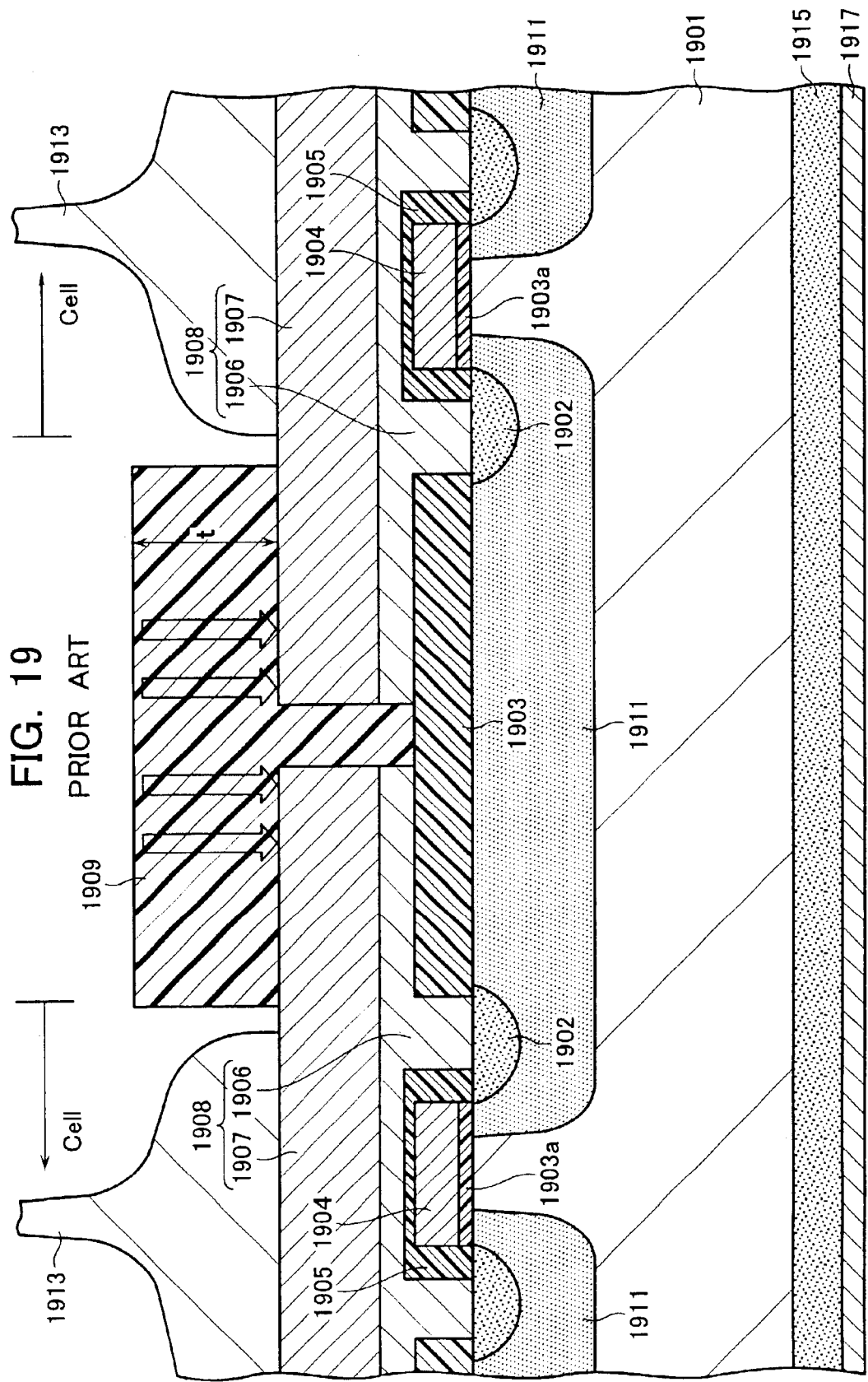
FIG. 19 is a sectional view of main part of one prior known semiconductor device.
Figure 20:
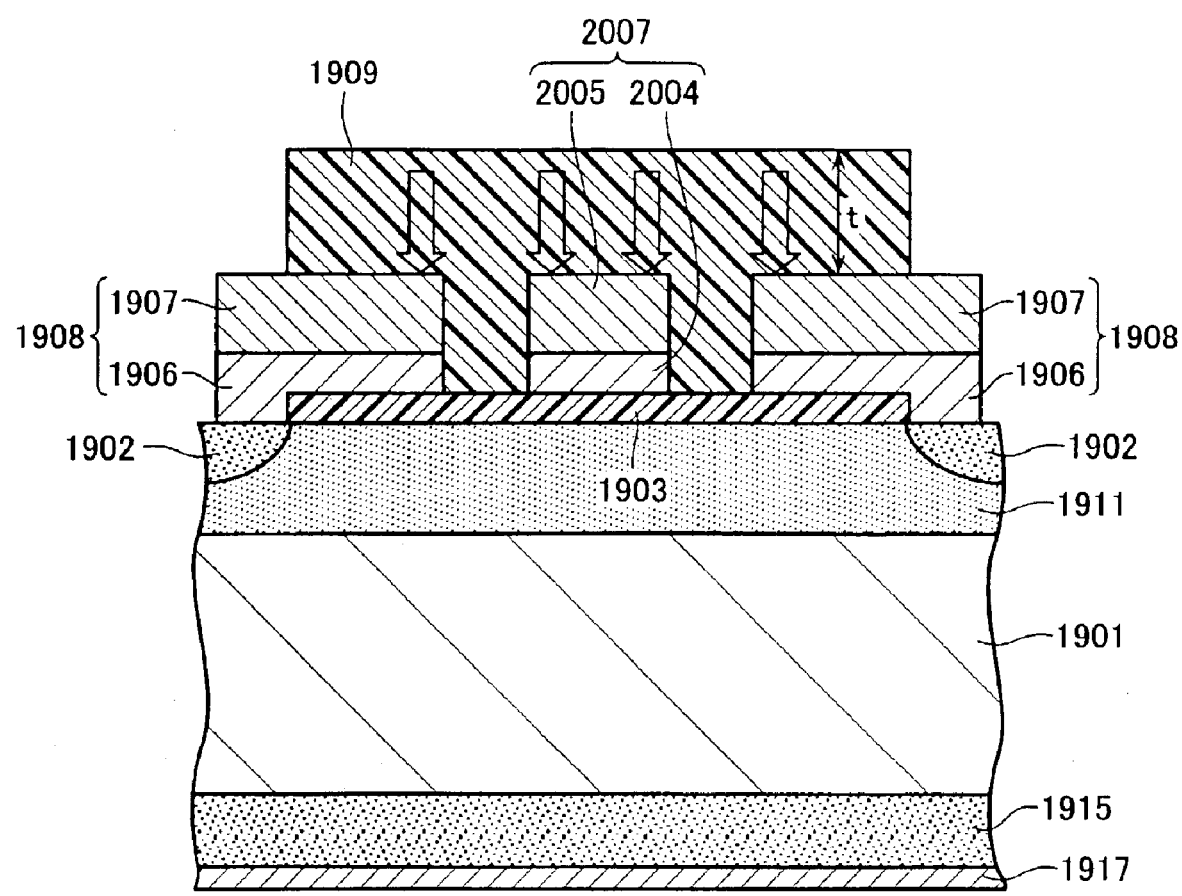
FIG. 20 is a sectional view of main part of another prior art semiconductor device.
Figure 21A:
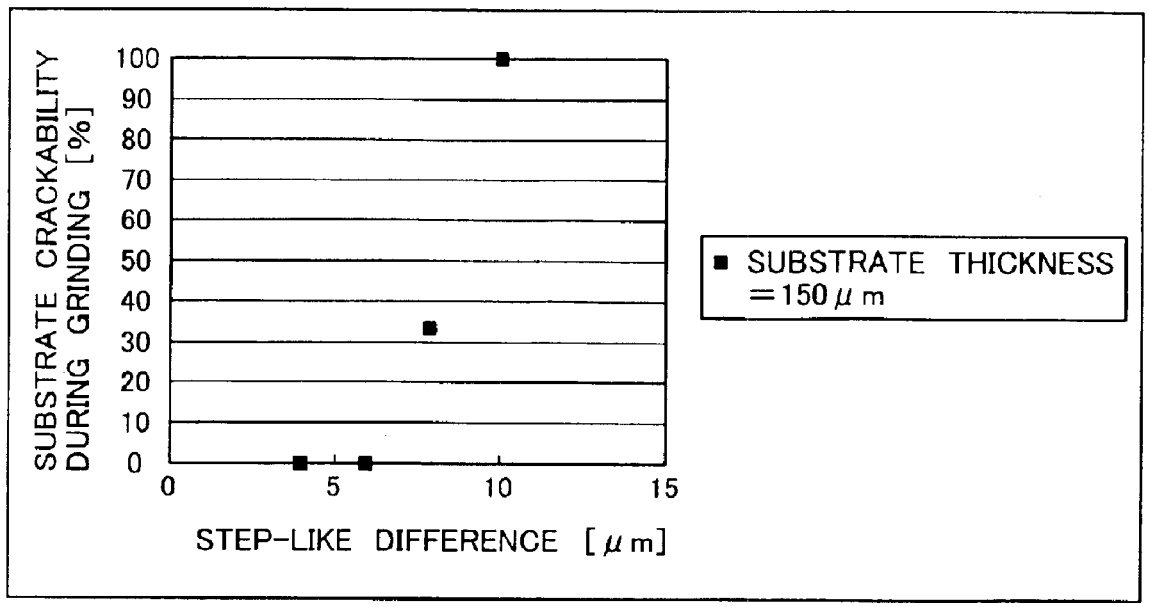
FIG. 21A is a diagram graphically showing simulation results of a relationship of the crackability of a substrate during its micro-machining or grinding process versus a substrate surface configuration with stair step-like irregularities or height differences when the substrate tested measures 150 µm in thickness.
Figure 21B:
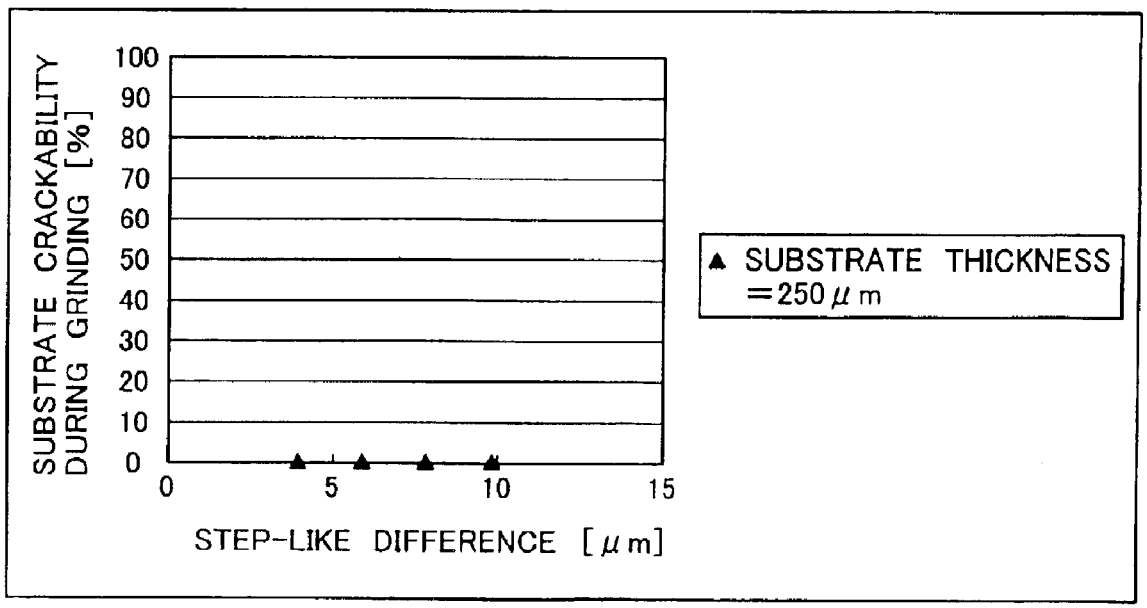
FIG. 21B is a graph showing simulation results of a relationship of substrate crackability during micro-grinding versus step-like surface height differences when the substrate thickness is 250 µm.

FIG. 18 shows a semiconductor device in accordance with a second modified example of the third embodiment. In this modification the device is formed to have a narrow gap between the sidewall of passivation film 1513 and its associated end wall of second electrode pattern 1508, thereby causing exposure of a corresponding top surface portion of the first electrode pattern 1507. The other structural arrangements are the same as those of the third embodiment so that an explanation thereof is omitted.

In the semiconductor device of the second modification also, the passivation film 1513 overlying the first electrode pattern 1507 including portions of the dielectric film 1506 each being between adjacent ones of the first electrode pattern 1507 and field plates 1510–1511 plus stopper electrode pattern 1512 has a predetermined thickness t and thus retains the passivation film functionality. And, the step-like surface difference that is created by the passivation film 1513 on first electrode pattern 1507 and field plates 1510–1511 plus stopper electrode pattern 1512 and the second electrode pattern 1508 is lessened to measure t–t1. Accordingly as in the third embodiment, it is possible to reduce the substrate deformability and crackability while simultaneously retaining the passivation film functionality.

Incidentally, the presence of the gap between the passivation film and the second electrode pattern hardly leads to the loss of passivation film functionality. This can be said because upper surface portions of the first electrode pattern, field plates and stopper electrode pattern in close proximity to the dielectric film portions each being between adjacent ones of the first electrode pattern and field plates plus stopper electrode pattern are covered or coated with the passivation film having the specified thickness. And, with this modification, it is possible to fabricate the passivation film while reducing complexities in the manufacturing process thereof.

In the third embodiment and its first and second modifications, the first and second electrode patterns are designed to have a rectangular ring-like planar shape such as shown in FIG. 10 as presented in conjunction with the first embodiment. The cell structure may be a trench-type MOSFET, trench IGBT, or any other types of currently available transistor devices and should not exclusively be limited to any specific one of them.

In the first to third embodiments the upper end of the passivation film overlying the first electrode pattern which end has the thickness t may be formed to become the same or lower than the upper end of second electrode pattern having the thickness t1 as far as desired function is obtainable.

More specifically, the film thickness relation may be $t \leq t1$. As the step-like surface difference as created by the passivation film on first electrode pattern and the second electrode pattern is lessened to $t1-t$, it is possible to reduce any unwanted deformation and cracking of the substrate otherwise occurring during the process for forming the substrate to a desired thickness while at the same time maintaining the passivation film functionality.

It has been described in detail that according to the present invention, in a semiconductor device having multilayer electrodes comprised of stacked conductive materials is provided, an electrode pattern at an upper layer level is formed to expose part of its underlying electrode pattern. A passivation film which is formed in order to protect an exposed portion of dielectric film is formed to cover or coat both the exposed dielectric film portion and its underlying exposed electrode pattern portion.

With such fabrication scheme, it is possible to lessen a step-like surface configuration or irregularity as created by the passivation film and the upper-layer electrode pattern while at the same time retaining the required passivation film functionality. This in turn makes it possible to provide a semiconductor device capable of reducing or minimizing any possible deformation and cracking of a substrate otherwise occurring during the process for forming the substrate to a desired thickness.

What is claimed is:

1. A semiconductor device comprising:
   first and second element formation regions formed to be spaced apart from each other in a main surface of a semiconductor substrate;
   a dielectric film formed on the main surface of said semiconductor substrate at a location between said first and second element formation regions;
   first electrode patterns being formed above said first and second element formation regions respectively and each having an end portion extended to overlie said dielectric film, said first electrode patterns being formed by patterning of a first electrode layer;
   second electrode patterns formed above said first electrode patterns respectively;
   a passivation film formed above said first electrode patterns to be positioned adjacent to said second electrode patterns while covering part of said dielectric film exposed during patterning of said first electrode layer;
   said first and second element formation regions are structural components of first and second cells respectively;
   said first electrode patterns are formed to have a first groove with a first width between the end portions thereof;
   said second electrode patterns are formed to have a second groove with a second width greater than said first width between their end portions to thereby permit partial exposure of upper surfaces of said first electrode patterns; and
   said passivation film is formed to bury said first groove and at least part of said second groove.

2. The semiconductor device according to claim 1, wherein said passivation film is formed to bury said first groove and said second groove and to have its end portion formed to extend above said second electrode patterns.

3. The semiconductor device according to claim 1, wherein said first and second cells comprise:
   a gate insulation film formed on or above said semiconductor substrate; and
   a gate electrode formed to be in contact with said gate insulation film.

4. The semiconductor device according to claim 1, wherein the first electrode patterns include a barrier metal.

5. The semiconductor device according to claim 4, wherein the second electrode patterns include a metal film.

6. The semiconductor device according to claim 5, wherein said metal film includes at least one of aluminum and copper.

7. The semiconductor device according to claim 1, wherein said passivation film includes a dielectric film formed on top of said semiconductor device.

8. The semiconductor device according to claim 1, wherein said passivation film includes a resin.

9. A semiconductor device comprising:
   diffusion regions formed in a main surface of a semiconductor substrate;
   a dielectric film being formed on or above the main surface of said semiconductor substrate and having contact holes leading to said diffusion regions;
   first electrode patterns in contact with said diffusion regions through said contact holes and having end portions extending above said dielectric film;
   second electrode patterns formed above said first electrode patterns; and
   a passivation film formed directly on said dielectric film and said first electrode patterns.

10. The semiconductor device according to claim 9, wherein said diffusion regions are first and second element formation regions formed at the main surface of said semiconductor substrate to be spaced apart from each other.

11. The semiconductor device according to claim 10, wherein
   said first and second element formation regions are for use as structural components of first and second cells respectively,
   said first electrode patterns are formed to have a first groove with a first width between said end portions,
   said second electrode patterns are formed to have a second groove with a second width greater than said first width between their end portions to thereby permit partial exposure of upper surfaces of said first electrode patterns, and
   said passivation film is formed to bury said first groove and at least part of said second groove.

12. The semiconductor device according to claim 11, wherein said passivation film is formed to bury said first groove and said second groove and has end portions formed to extend onto said second electrode patterns.

13. The semiconductor device according to claim 11, wherein said first and second cells comprise:
   a gate insulation film formed on or above said semiconductor substrate; and a gate electrode formed to be in contact with said gage insulation film.

14. The semiconductor device according to claim 9, wherein said first electrode patterns include a barrier metal.

15. The semiconductor device according to claim 14, wherein said second electrode patterns include a metal film.

16. The semiconductor device according to claim 15, wherein said metal film includes at least one of aluminum and copper.

17. The semiconductor device according to claim 9, wherein said passivation film includes a dielectric film formed at an uppermost layer of said semiconductor device.

18. The semiconductor device according to claim 9, wherein said passivation film includes a resin.

19. A semiconductor device comprising:

a semiconductor substrate;

a cell including said semiconductor substrate as its structural component and functioning as at least one of a semiconductor circuit element and a semiconductor switch;

a barrier metal being formed by patterning of a metal layer and becoming a structural component of an electrode pattern of said cells;

a dielectric film placed between said semiconductor substrate and said barrier metal;

a conductive pattern being formed above said barrier metal while being exposed to outside and becoming a structural component of said electrode pattern of said cell;

a passivation film formed to cover said dielectric film as exposed during patterning of said metal layer and also to locate adjacent to said conductive pattern over said barrier metal, wherein a plurality of cells are provided each of wchich is similar to said cell, said dielectric film is placed between said plurality of cells, a first groove is formed by letting said barrier metal of each of said plurality of cells extend to overlie said dielectric film between said plurality of cells, due to said conductive pattern of each of said plurality of cells, a second groove greater in width than said first groove is formed on said first groove, and said passivation film is formed to be buried in the first and second grooves between said plurality of cells.

20. The semiconductor device according to claim 19, wherein said cell comprises:

a vertically structured semiconductor circuit element.

21. The semiconductor device according to claim 19, wherein said electrode pattern of said cell is formed on or above one main surface of said semiconductor substrate, and said cell includes another electrode pattern as formed on or above a remaining main surface of said semiconductor substrate.

22. The semiconductor device according to claim 19, further comprising:

a wire coupled by bounding to said electrode of said cell.

23. The semiconductor device according to claim 19, further comprising:

a metal plate adhered to said electrode pattern of said cell.

* * * * *